United States Patent [19]

Nakano et al.

[11] Patent Number: 4,821,232
[45] Date of Patent: Apr. 11, 1989

[54] SEMICONDUCTOR MEMORY DEVICE HAVING DATA BUS RESET CIRCUIT

[75] Inventors: Masao Nakano, Kasugai; Tsuyoshi Ohira; Hirohiko Mochizuki, both of Kawasaki; Yukinori Kodama; Hidenori Nomura, both of Yokohama, all of Japan

[73] Assignees: Fujitsu Limited, Kawasaki; Fujitsu VLSI Limited, Kasugai, both of Japan

[21] Appl. No.: 97,556

[22] Filed: Sep. 16, 1987

[30] Foreign Application Priority Data

Sep. 19, 1986 [JP] Japan ............................... 61-221019

[51] Int. Cl.[4] ...................... G11C 13/00; G11C 11/40
[52] U.S. Cl. .................................... 365/189; 365/202
[58] Field of Search ............... 365/189, 203, 222, 202

[56] References Cited

U.S. PATENT DOCUMENTS

| 4,578,776 | 3/1986 | Takemae | 365/189 X |
| 4,584,670 | 4/1986 | Michael | 365/189 X |
| 4,589,096 | 5/1986 | Kaneko | 365/189 X |
| 4,601,017 | 7/1986 | Mochizuki | 365/189 |

Primary Examiner—Terrell W. Fears
Assistant Examiner—Alyssa Bowler
Attorney, Agent, or Firm—Armstrong, Nikaido, Marmelstein & Kubovcik

[57] ABSTRACT

A semiconductor memory device comprises a memory cell array comprising a plurality of memory cells arranged in a matrix arrangement, a sense amplifier, operatively connected to the memory cell array, amplifying a signal read out from one of the memory cells and having a pair of output terminals for outputting a complementary signal, a pair of data buses for transferring the complementary signal, a transfer gate for connecting the pair of output terminals to the pair of data buses responsive to a read operation, a data output buffer connected to the pair of data buses for outputting an output signal, and a reset circuit for resetting the pair of data buses to a predetermined voltage before each read operation responsive to a reset clock signal. The reset circuit comprises a first circuit connected to the pair of data buses for connecting the pair of data buses to a common node responsive to the reset clock signal, and a second circuit connected between the common node and a ground voltage for shifting a potential at the common node to a voltage which is the predetermined voltage greater than the ground voltage.

4 Claims, 5 Drawing Sheets

SEMICONDUCTOR MEMORY DEVICE HAVING DATA BUS RESET CIRCUIT

BACKGROUND OF THE INVENTION

The present invention generally relates to semiconductor memory devices, and more particularly to a semiconductor memory device having a reset circuit connected to a data bus pair.

As is well known, a semiconductor memory device generally comprises a memory cell array, a row decoder coupled to the memory cell array through word lines, an address buffer coupled to the row decoder, a sense amplifier and input/output gate coupled to the memory cell array through bit line pairs, a column decoder coupled to the sense amplifier and input/output gate, an address buffer coupled to the column decoder, input and output buffers coupled to the sense amplifier and input/output gate through a data bus pair, and the like. The data bus pair is reset before each read operation to a power source voltage or a ground voltage.

In the case where the reset voltage of the data bus pair is set to the power source voltage, the input/output gate is not turned ON until the voltage of a clock signal for opening and closing (that is, turning ON and OFF) the input/output gate exceeds a sum of a bit line potential and a threshold voltage of transistors constituting the input/output gate. But in the case where the reset voltage of the data bus pair is set to the ground voltage, the input/output gate is turned ON when the clock signal voltage exceeds the threshold voltage, and the timing with which the input/output gate is turned ON is quicker compared to the case where the reset voltage of the data bus pair is set to the power source voltage.

The output buffer outputs a read-out data by amplifying a potential difference between the two data buses constituting the data bus pair. For this reason, when it takes time for the potential difference to occur at the data bus pair, it takes that much longer for the output buffer to output the read-out data. In order to realize a memory device which operates at a high speed, it is necessary to speed up the data transfer between the bit line pair and the data bus pair.

In order to realize the high-speed data transfer between the bit line pair and the data bus pair, it is desirable to set the reset voltage of the data bus pair to the ground voltage. However, when the reset voltage is set to the ground voltage, the input/output gate is also turned ON when a noise is mixed in the clock signal and the clock signal voltage exceeds the threshold voltage. The turning ON of the input/output gate due to the noise may only occur for an instant, but there is a problem in that the charges on the bit line pair may leak thereby. A ground line for a clock generating circuit which generates the clock signal for the input/output gate is different from a ground line of a reset circuit for resetting the data bus pair, and the noise (or voltage increase) in the clock signal is inevitable since the noise is generated when a relatively large current flows to the ground line of the clock generating circuit.

SUMMARY OF THE INVENTION

Accordingly, it is a general object of the present invention to provide a novel and useful semiconductor memory device in which the problems described heretofore are eliminated.

Another and more specific object of the present invention is to provide a semiconductor memory device comprising a reset circuit for resetting a data bus pair responsive to a reset clock signal by applying to the data bus pair a predetermined voltage. This predetermined voltage is determined by a maximum level of a noise which may mix into a clock signal which is used to turn an input/output gate ON so as to couple a bit line pair to the data bus pair. According to the semiconductor memory device of the present invention, it is possible to carry out the data transfer from the bit line pair to the data bus pair at a high speed, thereby enabling a short access time to the semiconductor memory device. In addition, because the reset circuit applies the predetermined voltage to the data bus pair, the operation of the semiconductor memory device is substantially unaffected by the noise in the clock signal which is applied to the input/output gate.

Still another object of the present invention is to provide a semiconductor memory device comprising a memory cell array comprising a plurality of memory cells arranged in a matrix arrangement, a sense amplifier, operatively connected to the memory cell array, amplifying a signal read out from one of the memory cells and having a pair of output terminals for outputting a complementary signal, a pair of data buses for transferring the complementary signal, a transfer gate for connecting the pair of output terminals to the pair of data buses responsive to a read operation, a data output buffer connected to the pair of data buses for outputting an output signal, and a reset circuit for resetting the pair of data buses to a predetermined voltage before each read operation responsive to a reset clock signal. The reset circuit comprises a first circuit connected to the pair of data buses for connecting the pair of data buses to a common node responsive to the reset clock signal, and a second circuit connected between the common node and a ground voltage for shifting a potential at the common node to a voltage which is the predetermined voltage greater than the ground voltage.

Other objects and further features of the present invention will be apparent from the following detailed description when read in conjunction with the accompanying drawings.

DETAILED DESCRIPTION

First, a description will be given on the general operation of the conventional memory device, so as to facilitate the understanding of the present invention.

Figure 1:
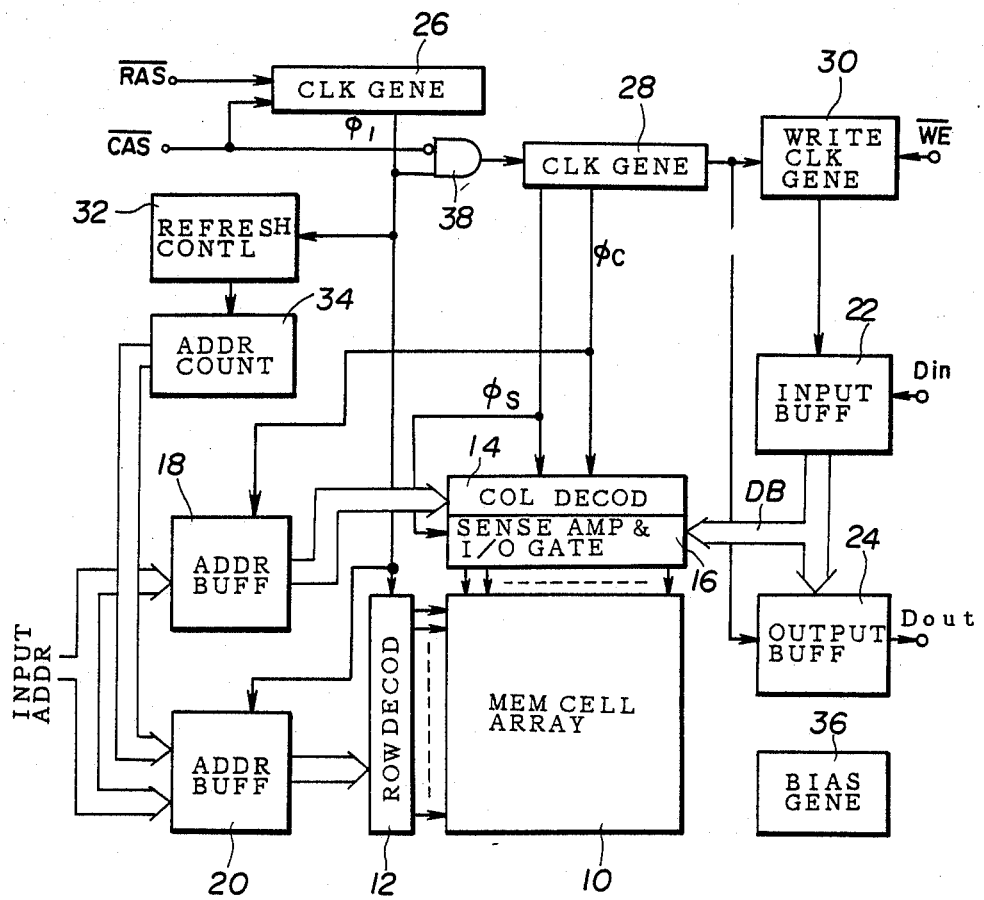
FIG. 1 is a system block diagram showing an example of the conventional memory device.

FIG. 1 shows an example of the conventional dynamic random access memory (DRAM). The DRAM generally comprises a memory cell array 10, a row decoder 12, a column decoder 14, a sense amplifier and input/output gate 16, address buffers 18 and 20, a data input buffer 22, a data output buffer 24, clock generators 26 and 28, a write clock generator 30, a refresh controller 32, an address counter 34 and an AND circuit 38 which are connected as shown, and a substrate bias generator 36 which supplies a bias voltage to a substrate (not shown) of the DRAM. In FIG. 1, $\overline{WE}$ denotes an inverted write enable signal, and $D_{in}$ denotes an input data (or write-in data).

The memory cell array 10 comprises an array of memory cells (not shown) each connected to a word line and a bit line. Generally, each memory cell of the DRAM is made up of one transistor and one capacitor, and a drain of the transistor is connected to the bit line and a gate of the transistor is connected to the word line. When a word line is selected by the row decoder 12, the transistors of all of the memory cells connected to the selected word line are turned ON and the capacitors of these memory cells are coupled to the bit lines. As a result, the potential at each bit line is changed according to the charge in the corresponding capacitor (stored information) of the memory cell.

Figure 2:
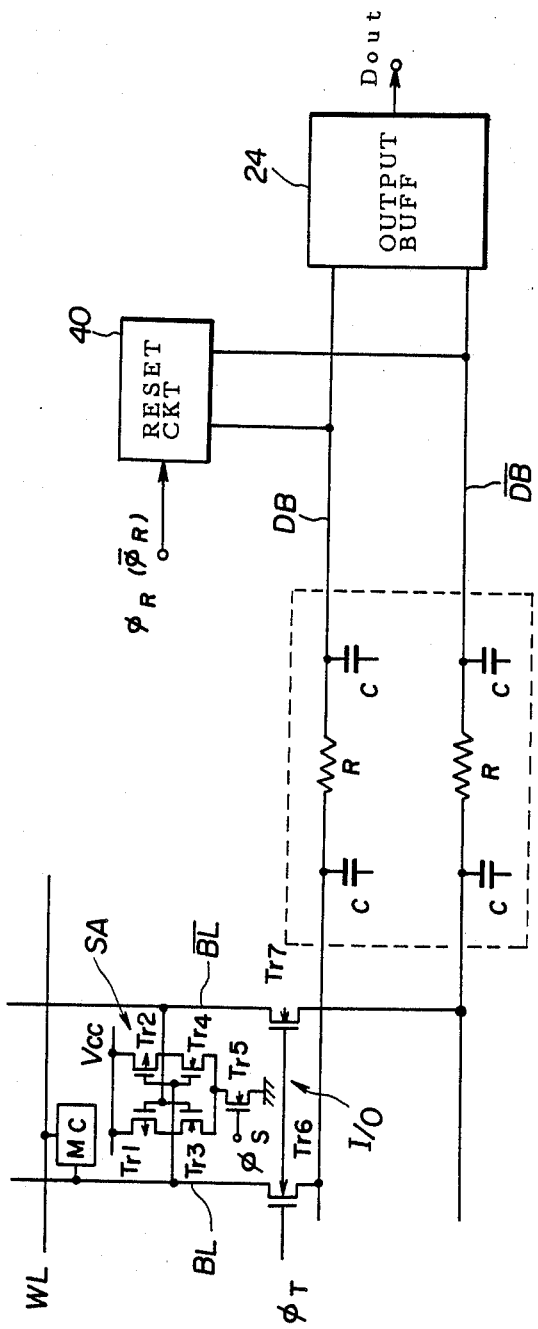
FIG. 2 is an equivalent circuit diagram showing a data bus part of the conventional memory device.

FIG. 2 shows an equivalent circuit of the data bus part of the conventional memory device for one bit line pair. A memory cell MC is connected to a word line WL and a bit line BL or $\overline{BL}$. Before each read operation, the bit lines BL and $\overline{BL}$ are precharged to Vcc/2, for example, where Vcc denotes the power source voltage. A sense amplifier SA senses and amplifies a potential difference between the bit line BL to which the stored information is read out from the memory cell MC and the bit line $\overline{BL}$ responsive to a clock signal $\phi_S$. The sense amplifier SA comprises two P-channel transistors Tr1 and Tr2 and three N-channel transistors Tr3, Tr4 and Tr5 which are connected as shown to constitute a flip-flop, and the sense amplifier SA becomes active when the transistor Tr5 is turned ON responsive to the clock signal $\phi_S$. As a result, one of the bit lines BL and $\overline{BL}$ having a higher level is pulled up to a power source voltage Vcc while the other of the bit lines BL and $\overline{BL}$ is pulled down to a ground voltage Vss. An input/output gate I/O selected by the column decoder 14 is turned ON responsive to a clock signal $\phi_T$, and the output of the sense amplifier SA obtained through a bit line pair constituted by the bit lines BL and $\overline{BL}$ is supplied to a data bus pair constituted by data buses DB and $\overline{DB}$. In other words, the input/output gate I/O connects the bit line pair to the data bus pair when turned ON and disconnects the bit line pair from the data bus pair when turned OFF. The data (complementary signal) on the data bus pair is read out as read-out data $D_{out}$ through the data output buffer 24. The input/output gate I/O comprises a pair of N-channel transistors Tr6 and Tr7 (transfer gates) which are respectively connected to the bit lines BL and $\overline{BL}$. The sense amplifier SA and the input/output gate I/O constitute the sense amplifier and input/output gate 16 for one bit line pair.

The data bus pair extends for a length amounting to approximately one-half of or the full width of a longer side of the semiconductor chip of the DRAM. Hence, the data bus pair can be described by the equivalent circuit indicated by a phantom line in FIG. 2 which is essentially an RC circuit comprising distributed resistances R and parasitic capacitances C. When the data is read out from the memory cell MC, the potential at one of the data bus pair becomes high while the potential at the other of the data bus pair becomes low. Before the next data is read out, the data bus pair is reset to the power source voltage Vcc, the ground voltage Vss or an intermediate voltage between the power source and ground voltages by a reset circuit 40 which operates responsive to a reset clock signal $\phi_R$ (or $\overline{\phi_R}$) and the reset data bus pair is coupled to the bit line pair so that the data buses DB and $\overline{DB}$ respectively take the high and low levels (or low and high levels) depending on the potentials at the corresponding bit lines BL and $\overline{BL}$.

Figures 3, 5:
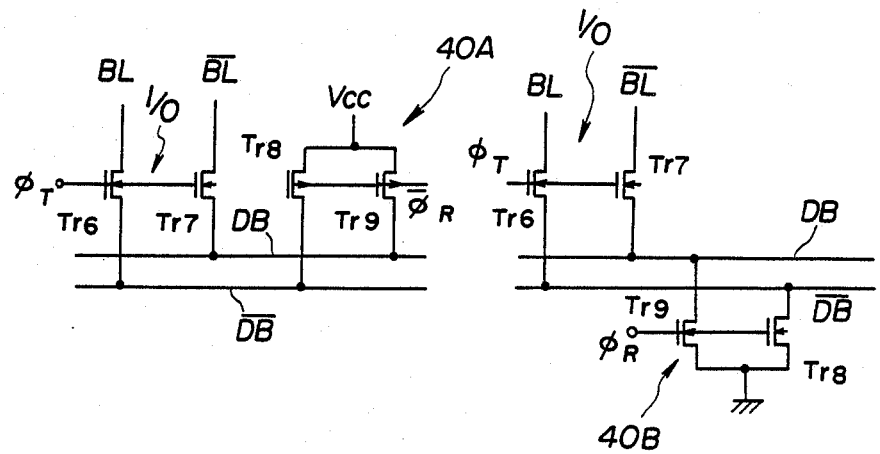
FIG. 3 is a circuit diagram showing an example of the conventional reset circuit for resetting a data bus pair to a power source voltage.
FIG. 5 is a circuit diagram showing an example of the conventional reset circuit for resetting the data bus pair to a ground voltage.

FIG. 3 shows an example of a reset circuit 40A for resetting the data bus pair to the power source voltage Vcc. In FIG. 3, those parts which are the same as those corresponding parts in FIG. 2 are designated by the same reference numerals, and a description thereof will be omitted. The reset circuit 40A comprises P-channel transistors Tr8 and Tr9 which are turned ON responsive to the reset clock signal $\overline{\phi_R}$. Hence, the data buses DB and $\overline{DB}$ are reset to the power source voltage Vcc responsive to the reset clock signal $\overline{\phi_R}$ as shown in FIG. 4.

Figure 4:
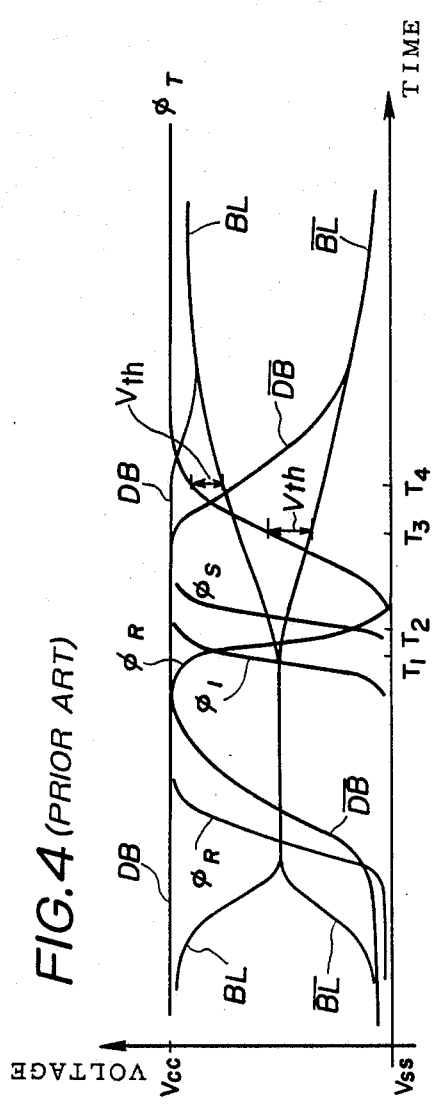
FIG. 4 is a time chart for explaining the read operation of the conventional memory device using the reset circuit shown in FIG. 3.

FIG. 4 is a time chart showing signal waveforms during a read operation when the reset circuit 40A is used. When an inverted row address strobe $\overline{RAS}$ is applied to the clock generator 26 shown in FIG. 1, the clock generator 26 generates an internal clock signal $\phi_1$. The address buffer 20 and the row decoder 12 are operated responsive to the internal clock signal $\phi_1$, and the word line WL shown in FIG. 2 is selected. In FIG. 4, the precharge level of the bit line pair is set to Vcc/2. The capacitor of the memory cell MC charges or discharges the bit line BL depending on the stored information, and the potential difference occurs between the bit lines BL and $\overline{BL}$ at a time T1 and after. The internal clock signal $\phi_1$ passes through the AND circuit 38 which is open due to a low-level inverted column address strobe $\overline{CAS}$, and is supplied to the clock generator 28. The clock generator 28 generates the clock signal $\phi_S$ which rises at a time T2 and after, and the sense amplifier SA of the sense amplifier and input/output gate 16 is made active responsive to the clock signal $\phi_S$. Hence, in this example, the sense amplifier SA pulls up the potential at the bit line BL to the power source voltage Vcc and pulls down the potential at the bit line $\overline{BL}$ to the ground voltage Vss as shown in FIG. 4.

The clock signal $\phi_S$ from the clock generator 28 is also supplied to the column decoder 14, and the column decoder 14 generates the clock signal $\phi_T$ according to the address from the address buffer 18. As described before, this clock signal $\phi_T$ is used to turn ON the selected input/output gate I/O (that is, the transistors Tr6 and Tr7). When N-channel metal oxide semiconductor (MOS) transistors are used for the transistors Tr6 and Tr7, the transistors Tr6 and Tr7 are turned ON to connect the bit line pair to the data bus pair when the gate potentials (that is, the clock signal $\phi_T$) become $V_{th}$ higher than the respective source potentials (that is, the potentials at the bit lines BL and $\overline{BL}$), where $V_{th}$ denotes the threshold voltage of the transistors Tr6 and Tr7. In FIG. 4, the clock signal $\phi_T$ becomes $V_{th}$ higher than the potential at the bit line $\overline{BL}$ at a time T3, and the clock signal $\phi_T$ becomes $V_{th}$ higher than the potential at the bit line BL at a time T4. Therefore, the potential difference between the data buses DB and $\overline{DB}$ only occurs at the time T4 and after as shown in FIG. 4.

FIG. 5 shows an example of a reset circuit 40B for resetting the data bus pair to the ground voltage Vss. In FIG. 5, those parts which are the same as those corresponding parts in FIG. 3 are designated by the same reference numerals, and a description thereof will be omitted. According to the reset circuit 40B, the data buses DB and $\overline{DB}$ are reset to the ground voltage Vss responsive to the reset clock signal $\phi_R$ as shown in FIG. 6.

Figure 6:
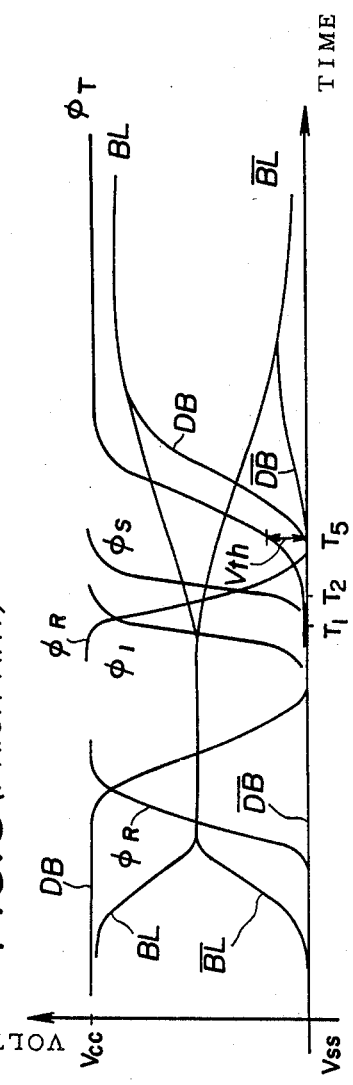
FIG. 6 is a time chart for explaining the read operation of the conventional memory device using the reset circuit shown in FIG. 5.

FIG. 6 is a time chart showing signal waveforms during a read operation when the reset circuit 40B is used. The precharge level of the bit line pair is also Vcc/2 in this case. The potential difference between the bit lines BL and $\overline{BL}$ occurs at the time T1 and after when the clock signal $\phi_1$ rises, and the sense amplifier SA operates to start amplifying the potential difference between the bit lines BL and $\overline{BL}$ at the time T2 and after. In this case, the bit line BL is pulled up to the power source voltage Vcc while the bit line $\overline{BL}$ is pulled down to the ground voltage Vss. The transistors Tr6 and Tr7 of the input/output gate I/O are turned ON at a time T5 responsive to the clock signal $\phi_T$ and the bit line pair is connected to the data bus pair. As a result, the data bus DB is pulled up to the power source voltage Vcc by the bit line BL. On the other hand, the data bus $\overline{DB}$ is first pulled up slightly by the bit line $\overline{BL}$ but is thereafter pulled down to the ground voltage Vss by the bit line $\overline{BL}$.

As may be seen by comparing FIGS. 4 and 6, the potential change on the data bus pair starts from the time T3 in FIG. 4 and starts from the time T5 in FIG. 6. In other words, the input/output gate I/O is not turned ON until the clock signal $\phi_T$ becomes greater than or equal to a sum of the potential at the bit line $\overline{BL}$ and the threshold voltage $V_{th}$ in the case shown in FIG. 4, but the input/output gate I/O is turned ON when the clock signal $\phi_T$ becomes greater than or equal to the threshold voltage $V_{th}$ in the case shown in FIG. 6. Hence, in the case shown in FIG. 6, the potential change on the data bus pair starts at the time T5 which occurs before the time T3.

The data output buffer 24 outputs the read-out data $D_{out}$ by amplifying the potential difference between the two data buses DB and $\overline{DB}$ constituting the data bus pair. For this reason, when it takes time for the potential difference to occur at the data bus pair, it takes that much longer for the data output buffer 24 to output the read-out data $D_{out}$. In order to realize a memory device which operates at a high speed, it is necessary to speed up the data transfer between the bit line pair and the data bus pair.

In order to realize the high-speed data transfer between the bit line pair and the data bus pair, it is desirable to set the reset voltage of the data bus pair to the ground voltage Vss as in the case shown in FIG. 5. However, when the reset voltage is set to the ground voltage Vss, the input/output gate I/O is also turned ON when a noise is mixed in the clock signal $\phi_T$ and the clock signal $\phi_T$ exceeds the threshold voltage $V_{th}$. The turning ON of the input/output gate I/O due to the noise may only occur for an instant, but there is a problem in that the charges on the bit line pair may leak thereby. A ground line for a clock generating circuit (not shown) which generates the clock signal $\phi_T$ for the input/output gate I/O is different from a ground line of the reset circuit 40B for resetting the data bus pair, and the noise (or voltage increase) in the clock signal $\phi_T$ is inevitable since the noise is generated when a relatively large current flows to the ground line of the clock generating circuit.

The present invention eliminates the problems of the conventional memory device by using a reset circuit which resets the data bus pair to a predetermined voltage determined by a maximum level of the noise which may mix into the clock signal $\phi_T$.

Figure 7:
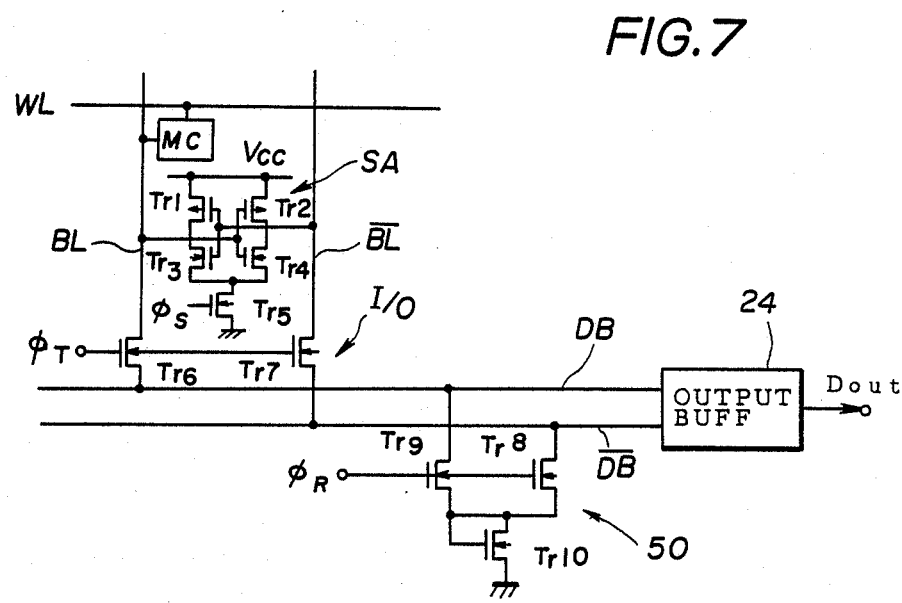
FIG. 7 is a circuit diagram showing an essential part of a first embodiment of the semiconductor memory device according to the present invention.

FIG. 7 shows an essential part of a first embodiment of the semiconductor memory device according to the present invention. In FIG. 7, those parts which are the same as those corresponding parts in FIG. 2 are designated by the same reference numerals, and a description thereof will be omitted. In the present embodiment, a reset circuit 50 comprises the N-channel transistors Tr8 and Tr9 and an N-channel transistor Tr10. The transistor Tr10 is connected between the ground and the sources of the transistors Tr8 and Tr9.

According to the present embodiment, the data buses DB and $\overline{DB}$ are connected to the ground through the transistor Tr10 when the transistors Tr8 and Tr9 are turned ON responsive to the clock signal $\phi_R$, and the data buses DB and $\overline{DB}$ are thus reset to a threshold voltage $V_{th1}$ of the transistor Tr10. When the data bus pair is reset to the threshold voltage $V_{th1}$, the input/output gate I/O will not be turned ON even when a noise is mixed into the clock signal $\phi_T$ as long as the noise level is within $V_{th}+V_{th1}$. As a result, it is possible to prevent the charges on the bit lines BL and $\overline{BL}$ from leaking due to the noise in the clock signal $\phi_T$.

Figure 8:
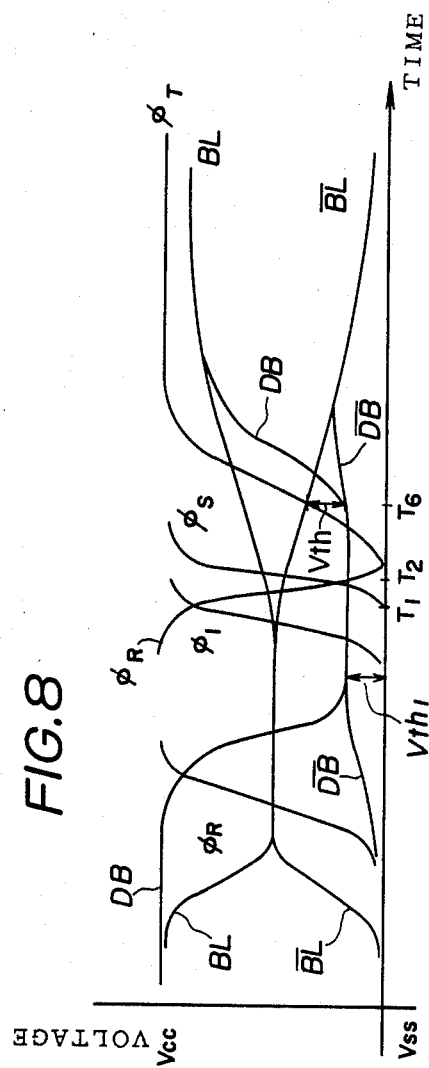
FIG. 8 is a time chart for explaining the read operation of the first embodiment of the memory device shown in FIG. 7.

FIG. 8 is a time chart showing signal waveforms during a read operation when the reset circuit 50 is used. The precharge level of the bit line pair is also Vcc/2 in this case. The potential difference between the bit lines BL and $\overline{BL}$ occurs at the time T1 and after when the clock signal $\phi_1$ rises, and the sense amplifier SA operates to start amplifying the potential difference between the bit lines BL and $\overline{BL}$ at the time T2 and after. In this case, the bit line BL is pulled up to the power source voltage Vcc while the bit line $\overline{BL}$ is pulled down to the ground voltage Vss. The transistors Tr6 and Tr7 of the input/output gate I/O are turned ON at a time T6 responsive to the clock signal $\phi_T$ and the bit line pair is connected to the data bus pair. As a result, the data bus DB is pulled up to the power source voltage Vcc by the bit line BL. On the other hand, the data bus $\overline{DB}$ is first pulled up slightly by the bit line $\overline{BL}$ but is thereafter pulled down to the ground voltage Vss by the bit line $\overline{BL}$. As may be seen by comparing FIGS. 8 and 6, the potential change on the data bus pair starts from the time T6 in FIG. 8 which occurs after the time T5.

Figure 9:
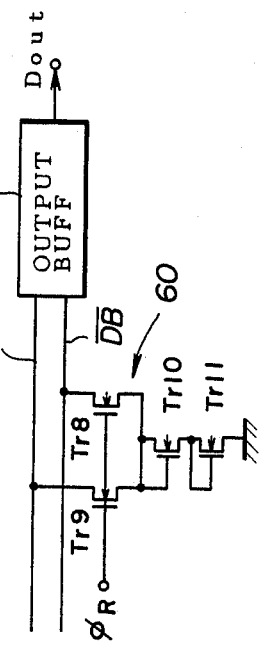
FIG. 9 is a circuit diagram showing an essential part of a second embodiment of the semiconductor memory device according to the present invention.

FIG. 9 shows an essential part of a second embodiment of the semiconductor memory device according to the present invention. In FIG. 9, the illustration of the input/output gate I/O, the sense amplifier SA and the like is omitted, and those parts which are the same as those corresponding parts in FIG. 7 are designated by the same reference numerals. In FIG. 9, a reset circuit 60 comprises the N-channel transistors Tr8 and Tr9 and N-channel transistors Tr10 and T11. The transistors Tr11 and Tr10 are connected in series between the ground and the sources of the transistors Tr8 and Tr9.

According to the present embodiment, the data buses DB and $\overline{DB}$ are connected to the ground through the transistors Tr10 and Tr11 when the transistors Tr8 and Tr9 are turned ON responsive to the clock signal $\phi_R$, and the data buses DB and $\overline{DB}$ are thus reset to a sum of the threshold voltages $V_{th1}$ of the transistors Tr10 and Tr11, that is, reset to $2V_{th1}$. When the data bus pair is reset to the voltage $2V_{th1}$, the input/output gate I/O will not be turned ON even when a noise is mixed into the clock signal $\phi_T$ as long as the noise level is within $V_{th}+2V_{th1}$. As a result, it is possible to prevent the charges on the bit lines BL and $\overline{BL}$ from leaking due to the noise in the clock signal $\phi_T$. But the connection of the bit line pair to the data bus pair becomes slow compared to the first embodiment, and the bit line pair is only connected to the data bus pair after the clock signal $\phi_T$ rises an amount greater than that required in the first embodiment.

The illustration of a time chart for explaining the read operation in the second embodiment will be omitted, since those skilled in the art can readily understand the operation from FIG. 8.

The transistor Tr10 in the first embodiment and the transistors Tr10 and Tr11 in the second embodiment constitute a level shifting circuit, respectively, for shifting a voltage a predetermined voltage from the ground voltage Vss and for setting the reset voltage of the data buses DB and $\overline{DB}$ to the predetermined voltage which is greater than the ground voltage Vss and is smaller than the power source voltage Vcc. It is not essential that the threshold voltages of the transistors Tr10 and Tr11 are the same.

The reset voltage of the data bus pair is desirably set to a voltage which is small as possible but sufficiently large to prevent the input/output gate I/O from turning ON responsive to the noise in the clock signal $\phi_T$. Hence, the reset voltage should be determined according to the maximum level of noise which may mix into the clock signal $\phi_T$, and the reset voltage is preferably set to $V_{th1}$ or $2V_{th1}$ as in the case of the first and second embodiments. It is possible to make the circuit construction of the reset circuit simple when the reset voltage is set to $V_{th1}$ or $2V_{th1}$. In other words, it is only necessary to connect one or two MOS transistors between the ground and the sources of the transistors Tr8 and Tr9. On the other hand, when the reset voltage is set to other voltages, it is necessary to use a voltage dividing circuit or the like and the circuit construction of the reset circuit becomes complex compared to those of the described embodiments.

The present invention is not effective against a memory device in which the clock signal $\phi_T$ is not raised until a potential difference between the bit lines BL and $\overline{BL}$ stabilizes. However, in order to realize a memory device which operates at a high speed, the clock signal $\phi_T$ is naturally raised before the potential difference between the bit lines BL and $\overline{BL}$ stabilizes, and the present invention would therefore be effective against such a memory device which operates at the high speed.

Further, the present invention is not limited to these embodiments, but various variations and modifications may be made without departing from the scope of the present invention.

What is claimed is:

1. A semiconductor memory device comprising:
   a memory cell array comprising a plurality of memory cells arranged in a matrix arrangement;
   a sense amplifier, operatively connected to said memory cell array, amplifying a signal read out from one of said memory cells and having a pair of output terminals for outputting a complementary signal;
   a pair of data buses for transferring the complementary signal;
   a transfer gate for connecting said pair of output terminals to said pair of data buses responsive to a read operation;
   a data output buffer connected to said pair of data buses for outputting an output signal; and
   a reset circuit for resetting said pair of data buses to a predetermined voltage before each read operation responsive to a reset clock signal,
   said reset circuit comprising a first circuit connected to said pair of data buses for connecting said pair of data buses to a common node responsive to said reset clock signal, and a second circuit connected between said common node and a ground voltage for shifting a potential at said common node to a voltage which is said predetermined voltage greater than said ground voltage.

2. A semiconductor memory device as claimed in claim 1 in which said first circuit comprises a first transistor connected between one of said pair of data buses and said common node and a second transistor connected between the other of said pair of data buses and said common node, said first and second transistors being controlled of ON/OFF states thereof responsive to said reset clock signal, and said second circuit comprises a third transistor connected between said common node and said ground voltage, said third transistor being controlled of ON/OFF state thereof responsive to the potential at said common node, said predetermined voltage being determined by a threshold voltage of said third transistor.

3. A semiconductor memory device as claimed in claim 1 in which said first circuit comprises a first transistor connected between one of said pair of data buses and said common node and a second transistor connected between the other of said pair of data buses and said common node, said first and second transistors being controlled of ON/OFF states thereof responsive to said reset clock signal, and said second circuit comprises third and fourth transistors connected in series between said common node and said ground voltage, said third transistor being controlled of ON/OFF state thereof responsive to the potential at said common node, said fourth transistor being controlled of ON/OFF state thereof responsive to a potential at a node between said third and fourth transistors, said predetermined voltage being determined by sum of threshold voltages of said third and fourth transistors.

4. A semiconductor memory device as claimed in claim 1 in which said transfer gate connects said pair of output terminals to said pair of data buses responsive to a clock signal, said predetermined voltage being determined so that a maximum level of a noise which mixes into said clock signal is less than a sum of said predetermined voltage and a threshold voltage of transistors constituting said transfer gate.

* * * * *